United States Patent [19]

Nakamura et al.

[11] Patent Number: 4,706,101
[45] Date of Patent: Nov. 10, 1987

[54] LIGHT EMITTING DIODE FORMED OF A COMPOUND SEMICONDUCTOR MATERIAL

[75] Inventors: Masaru Nakamura, Kawaguchi; Masaki Okajima; Tadashi Komatsubara, both of Tokyo; Tetsuo Sadamasa, Chigasaki; Koichi Nitta, Yokohama, all of Japan

[73] Assignee: Kabushiki Kaisha Toshiba, Kawasaki, Japan

[21] Appl. No.: 767,425

[22] Filed: Aug. 20, 1985

[30] Foreign Application Priority Data

Oct. 27, 1984 [JP] Japan ............................... 59-226154
Jan. 31, 1985 [JP] Japan ................................. 60-16789

[51] Int. Cl.[4] .......................................... H01L 33/00
[52] U.S. Cl. ..................................... 357/17; 357/16; 372/45; 372/46
[58] Field of Search ................... 357/17, 16, 45, 46, 357/43; 372/45, 46, 43

[56] References Cited

U.S. PATENT DOCUMENTS

| | | | |
|---|---|---|---|
| 3,936,855 | 2/1976 | Goell et al. | 357/17 |
| 4,053,914 | 10/1977 | Goodwin | 372/45 |
| 4,184,170 | 1/1980 | Burnham et al. | 357/17 |
| 4,447,822 | 5/1984 | Chin et al. | 357/17 |

OTHER PUBLICATIONS

Materials Letters, vol. 2, No. 3, Feb. 1984, pp. 184–188, Amsterdam, NL; S. Mahajan et al., "The Origin of Dark Spot Defects in InP/InGa As P Aged Light Emitting Diodes", FIG. 1, p. 184, last paragraph.
Applied Physics Letters, vol. 43, No. 1, Jul. 1, 1983, pp. 103–105, New York (US), K. Mohammed et al.: "Effects of V/III Variation on the Optical Properties of GaAs and GaACAs Grown by Metalorganic Chemical Vapor Deposition".
Optical Communication; 9th European Conference of Optical Communication–ECOC83, Genev. 23-26 Oct. 1983, (Switzerland); edited by H. Melchior & A. Sollberger, Institute for Applied Physics, Zurich (CH), pp. 471–474, M. Krakowski et al.: AlGaAs/GaAs Double Heterostructure Super Luminescent Diodes for Fibre Gyro. *Abstract; p. 471, paragraphs 5 and 6, FIG. 1.
IEEE Journal of Quantum Electronics, vol. QE15, No. 3, Mar. 1979, pp. 128–135, New York (US), R. Dupuis et al.: "Preparation and Properties of GaAlAs–GaAs Heterostructure Lasers Grown by Metal Organic Chemical Vapor Deposition".
Ibid, vol. QE17, No. 3, Mar. 1981, pp. 387–391, New York (US), T. P. Lee: "Improved Molecular Beam Epitaxial Growth of AlGaAs/GaAs High Radiance LED's for Optical Communications.", *FIG. 1; Section II and Section V*.
European Conference of Optical Communication Held at Cannes (FR), 21–24 Sep. 1982; Communication B1-4, pp. 118–123, P. Hirtz et al., "Life Tests of L.P.E. and M.O.V.P.E. Shallow Proton Stripe GaInAsP Laser Diodes", *p. 120, section 3, entitled "Metal Organic Vapour Phase Epitaxy"; FIG. 3.
Japanese Journal of Applied Physics, vol. 22, No. 7, part 2, Jul. 1983, pp. L450–L451, Tokyo (JP), Y. Shinoda et al.: "GaAs Light Emitting Diodes Fabricated on SiO2/Si Wafers.", *p. L450, left hand col., last paragraph–right–hand col., pentultimate paragraph*.
Applied Physics Letters, vol. 43, No. 1, Jul. 1, 1983, pp. 103–105, New York (US), K. Mohammed et al.: "Effect of V/III Variation of GaAs and GaACAs Grown by Metalorganic Chemical Vapor Deposition".
J. Cryst. Growth; vol. 55, 1981, pp. 223–228.

*Primary Examiner*—James W. Davie
*Assistant Examiner*—Georgia Y. Epps
*Attorney, Agent, or Firm*—Oblon, Fisher, Spivak, McClelland, & Maier

[57] ABSTRACT

A light emitting diode is disclosed which includes an N-GaAs substrate, a double hetero-junction structure obtained by forming an N-GaAlAs clad layer, a P-GaAs active layer and a P-GaAlAs clad layer on the substrate in that order, and a current narrowing structure obtained by selectively forming a contact metal on the P-GaAlAs clad layer in the double hetero-junction structure with the contact metal formed around the contact metal. In the light emitting diode so manufactured, the double hetero-junction structure is formed by a metal organic vapor deposition method. The N-GaAlAs clad layer is of a three-layer structure with one layer of a narrower forbidden band width sandwiched between the remaining two layers of a wider forbidden band width.

10 Claims, 13 Drawing Figures

LIGHT EMITTING DIODE FORMED OF A COMPOUND SEMICONDUCTOR MATERIAL

BACKGROUND OF THE INVENTION

This invention relates to a light emitting diode excellent in larger quantity production and, in particular, to a light emitting diode of a double heterojunction structure using a compound semiconductor material.

Recently, optical subscriber transmission systems are beginning to acquire a quick and wide acceptance in the art. Among them, a light emitting diode (LED) can be manufactured at low cost with high reliability as compared with a laser diode (LD) and does not encounter, for example, any modal noise resulting from a combination of the LD with multi-mode fiber. From this, it will be understood that the LED is a key device of the above-mentioned optical subscriber transmission system.

Though inexpensive, the LED is very much higher in cost than general electric parts. Thus, in order for the optical subscriber transmission system to become generally accepted, it is essential that the LED's be inexpensive.

A low yield in the manufacture of the LED's constitutes one of the major bars to the realization of the low-cost LED's. At present, during the manufacture of LED's, the respective layers are formed by a LPE (liquid phase epitaxy) method. However, the LPE method must be applied generally to small wafer areas, and a poor uniformity in the thickness of the respective films and in the composition is involved. Thus, it may be said that the LPE method is not suitable for a large quantity production of LED's. The use of the LPE method causes drooping at a layer-to-layer interface due to the lack of sharpness at the interface, resulting in the lowered light emission efficiency of the active layer. The use of the LPE method assures no excellent light emission characteristic. In order to increase input power to the optical fiber a lens is attached to the LED wafer. This step also presents a bar to the obtainment of low-cost LED's.

In the LD, on the other hand, the use of a MOCVD (Metal Organic Chemical Vapor Deposition) method in the crystal growth step is now under study. When the MOCVD method is used for the manufacture of LED's, the light emission efficiency is markedly lowered. In the case of the LD, since light is emitted due to the induced emission, the lowered light emission efficiency at the active layer offers no great problem. For the LED, on the other hand, the lowered light emission efficiency produces a fatal defect. As appreciated from the above, the use of the MOCVD method has been believed unsuitable for the manufacture of LED's.

SUMMARY OF THE INVENTION

It is accordingly the object of this invention to provide a light emitting diode which is higher in light emission efficiency and excellent in quantity production.

According to this invention the above-mentioned object can be attained by the following specific arrangement.

That is, according to this invention there is provided a light emitting diode comprising a semiconductor substrate of a first conductivity type, a double hetero-junction structure obtained by sequentially forming at least a clad layer of a first conductivity type, an active layer of the first conductivity type or a second conductivity type and a clad layer of the second conductivity type on the substrate, and a current narrowing structure obtained by selectively forming a contact metal on the clad layer of the second conductivity type in the double hetero-junction structure with an insulating film or a reverse junction formed around the contact metal, in which the double hetero-junction structure is formed by an MOCVD method.

According to this invention a light emitting diode is provided which comprises a semiconductor substrate of a first conductivity type, a double hetero-junction structure obtained by sequentially forming at least a clad layer of a first conductivity type, an active layer of the first conductivity type or a second conductivity type and a clad layer of the second conductivity type on the substrate, and a current narrowing structure obtained by selectively forming a contact metal on the clad layer of the second conductivity type in the double hetero-junction structure with an insulating film or a reverse junction formed around the contact metal, in which the double hetero-junction structure is formed by the MOCVD method, MBE (molecular beam epitaxial growth) method, etc., and among the clad layers in the double hetero-junction structure the N-type clad layer formed by doping an N-type impurity has a greater forbidden band width than that of the active layer and provides a multi-layer structure whose layers are different from each other in a composition ratio.

According to this invention it is possible to obtain the following advantages:

(1) It is possible to obtain a very uniform wafer of a larger diameter by the MOCVD method. This invention is, therefore, effective for the quantity production of LED's, assuring a low manufacturing cost.

(2) Since a sharp layer-to-layer interface is obtained by the MOCVD method, it is possible to form an ideal double hetero-junction structure. For this reason, the complete containment of carriers is achieved, effectively serving to enhance the light emission efficiency.

(3) The positive containment of injection carriers can be achieved by adequately enlarging the forbidden band of that N-type clad layer of a multi-layer structure which is located at the side of the active layer. Furthermore, the forbidden band of the clad layer distant from the active layer is made smaller, adequately enhancing the carrier concentrations and thus adequately decreasing the spreading resistance at the clad layer. The LED's of this invention, even if manufactured by, for example, the MOCVD or MBE method, involve no saturated or lowered light emission power and thus assure a higher quantity production and higher power output.

DETAILED DESCRIPTION OF THE PREFERRED EMBODIMENTS

First, the fundamental principle of this invention will be explained below before an explanation of the embodiments of this invention.

The summary of this invention resides in that a MOCVD method is used for the crystal growth of a double hetero-junction structure and that the lowering of the light emission efficiency of LED's can be suppressed even if the MOCVD method is used.

The inventors have conducted various experiments using the MOCVD method whereby LED's are manufactured, and found that the resultant lowered light emission efficiency of the LED as prepared by the MOCVD method is due to a defective element, such as a contaminated row material and to improper parameters. That is, the MOCVD method is still novel and in the MOCVD method which has conventionally been practiced, its merits could not be obtained to full satisfaction.

When LED's are prepared with various associated parameters optimally set and without using any such defective element, it has been found possible to obtain the light emission efficiency substantially as high as, or higher than, that of LED's with the use of the LPE method. Here, the use of the MOCVD method assures an excellent uniformity in the thickness of the layers and in the composition as well as permiting a wider wafer area to be taken. Under the above-mentioned requirements, LED's of high efficiency can be implemented at low cost with the use of the MOCVD method.

The embodiments of this invention will be explained below by referring to the accompanying drawings.

Figure 1:
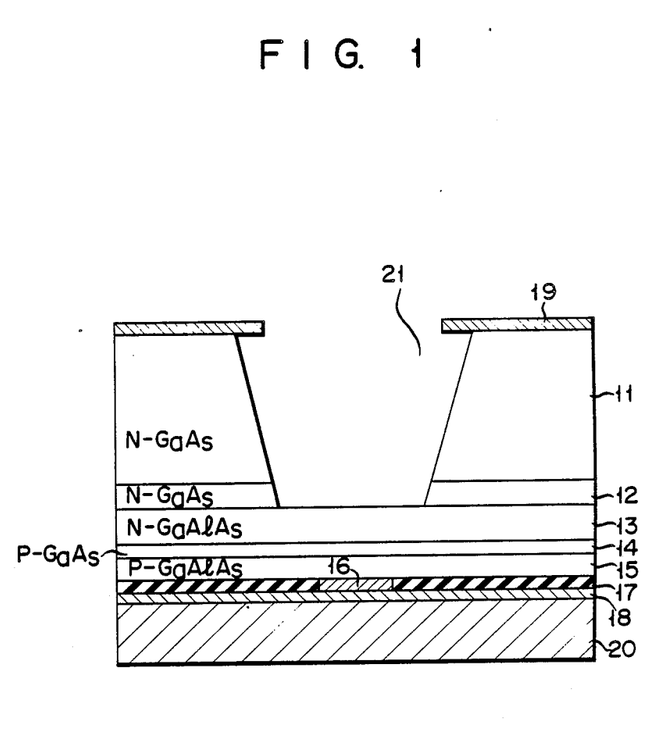
FIG. 1 is a cross-sectional view showing the arrangement of a Burrus type light emitting diode (LED) according to one embodiment of this invention.

FIG. 1 is a cross-sectional view showing an arrangement of a Burrus type LED according to a first embodiment of this invention. In FIG. 1, reference numeral 11 shows an N-GaAs substrate; 12, an N-GaAs buffer layer; 13, a first clad layer of N-GaAlAs; 14, a P-GaAs activated layer; and 15, a second clad layer of P-GaAlAs. In this way, a double hetero-junction structure is formed, noting that the buffer layer 12, first clad layer 13, active layer 14 and second clad layer 15 are grown by the MOCVD method.

Reference numeral 16 shows a contact metal layer of AuZn and 17 shows an SiO$_2$ layer, these layers constituting a current narrowing structure. 18 shows a P-side electrode; 19, an N-side electrode; 20, a heat sink comprised of an Au layer; and 21, a light pick-up window.

Figure 2A:
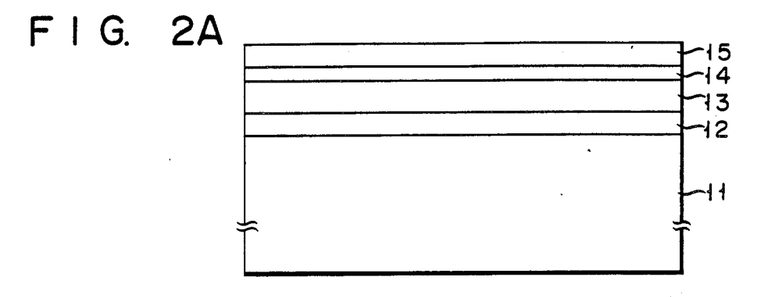
FIGS. 2A to 2E are cross-sectional views showing the steps of manufacture of the LED.

FIGS. 2A to 2E are cross-sectional views showing the steps of manufacturing a LED structure as set out above. As shown in FIG. 2A, an N-GaAs buffer layer 12, first clad layer 13 of N-Ga$_{0.65}$Al$_{0.35}$As, P-GaAs active layer 14 and second clad layer 15 of P-Ga$_{0.65}$Al$_{0.35}$As are sequentially grown, by the MOCVD method, on an N-GaAs substrate 11 in that order. Here, the carrier concentration, thickness, etc., of the respective layers 12 to 15 are shown in Table 1 below.

TABLE 1

| Samples | AlAs mixed crystal ratio | Carrier concentration cm$^{-3}$ | thickness $\mu$m |
|---|---|---|---|
| buffer layer 12 | — | n = 2 × 10$^{17}$ | 2.0 |
| clad layer 13 | 0.35 | n = 2 × 10$^{17}$ | 3.0 |
| active layer 14 | — | p = 4 × 10$^{17}$ | 1.0 |
| clad layer 15 | 0.35 | p = 5 × 10$^{18}$ | 2.0 |

Se is used as an N-type dopant and Zn is used as a P-type dopant. The crystal growth temperature is set at 750 [°C.] under such conditions that it is possible to obtain a high light emission efficiency and better surface state. As a row material, use was made of trimethylgallium [(CH$_3$)$_3$Ga], trimethylaluminum [(CH$_3$)$_3$Al] and arsine [AsH$_3$]. Diethyl zinc [(C$_2$H$_5$)$_2$Zn] was used as a P-type dopant and hydrogen selenide [H$_2$Se] was used as an N-type dopant. A molar ratio between Group III element (Ga, Al) and Group V (As) in a feed gas is given below:

[As]/[Ga+Al]=30

Figure 2B:
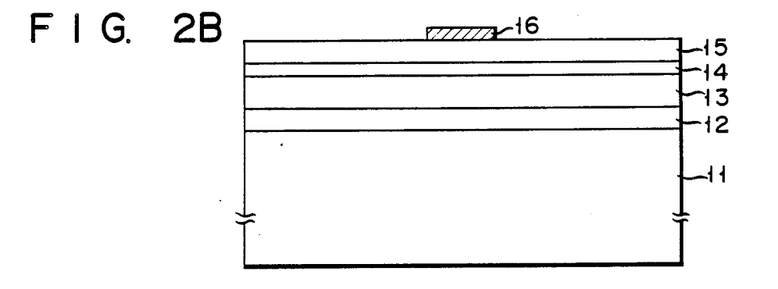
Figure 2C:
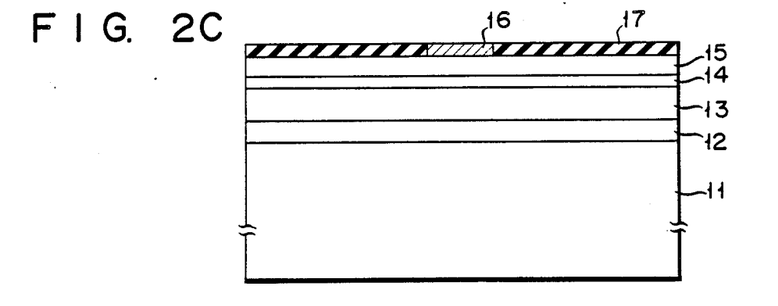

Then, as shown in FIG. 2B, an ohmic electrode (contact metal) 16 of AuZn (5% Zn) was formed on the whole surface of the second clad layer 15 to have a thickness of 3,000 to 4,000 [Å]. The electrode 16 was etched with a I$_2$—KI—H$_2$O (weight ratio 1 : 1 : 4)—based etching solution with a photoresist as a mask to leave a circular electrode 16 to 30 [$\mu$m] in diameter. After the photoresist was removed, a 3,000 [Å]-thick SiO$_2$ film 17 was formed by a CVD method on the whole surface of the resultant structure as shown in FIG. 2C. With the photoresist as a mask, the SiO$_2$ film on the ohmic electrode 16 was selectively removed, noting that a ammonium fluoride solution was used as such an etching solution.

Figure 2D:
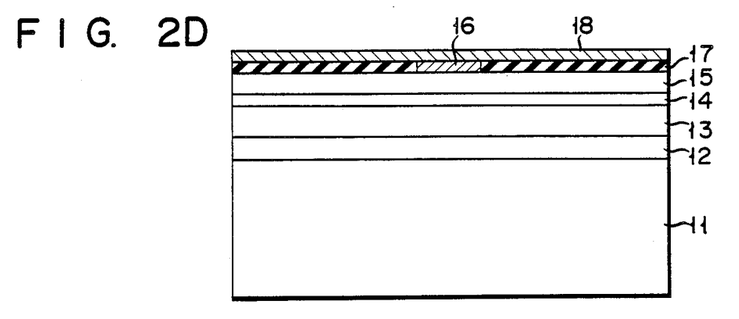
Figure 2E:
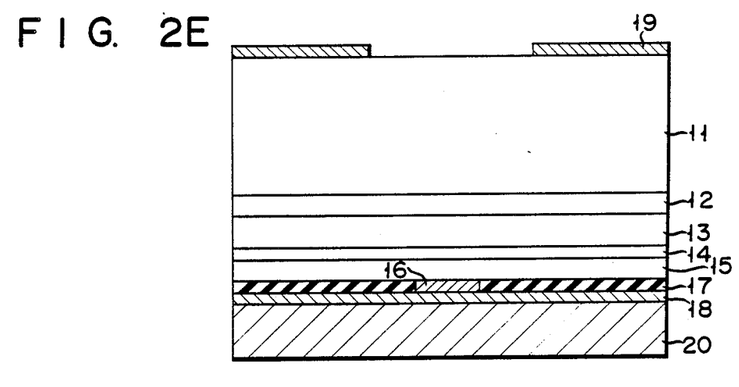

As shown in FIG. 2D, Cr and Au layers were sequentially formed with the thickness of 1,000 [Å] and 5,000 [Å], respectively, to provide a P-side electrode 18. Then, the substrate 11 of 300 to 350 [$\mu$m] in thickness was polished at its rear surface side to obtain an about 80 [$\mu$m]-thick substrate 11. As shown in FIG. 2E, AuGe (0.5% Ge) and Au layers were formed on the rear surface side of the substrate 11 to have the thickness of 5,000 [Å] and 1,000 [Å], respectively, to provide an N-side electrode 19. With the photoresist as a mask, the N-side electrode 19 was etched to leave a circle space of 150 [$\mu$m] in diameter facing the ohmic electrode 16. Then, a 20 [$\mu$m]-thick heat sink 20 of Au was formed by an electroplating method on the surface of the P-side electrode 18.

Thereafter, in the state as shown in FIG. 2E, with the N-side electrode 19 as a mask the substrate 11 and buffer layer 12 were etched, with an NH$_4$OH-based etching solution, to a depth leading to the clad layer 13. In this way, a light pick-up window 21 was formed. As a result, a Burrus type LED as shown in FIG. 1 was completed.

The LED so obtained showed an improved external quantum efficiency of more than 3 [%], reflecting a high-quality crystallinity and a sharp, better interface characteristic realized by the MOCVD method. The LED was butt-jointed to a GI fiber with a core diameter of 50 [$\mu$m] and clad diameter of 125 [$\mu$m], producing an optical fiber output of more than 110 [μW], i.e. an excellent output, at a current level of 100 [mA]. If, as in this case, the optical fiber is formed to have a spherical end, an optical fiber output of more than 230 [μW], a world highest level at present, was manifested as the excellent characteristic.

Figure 3:
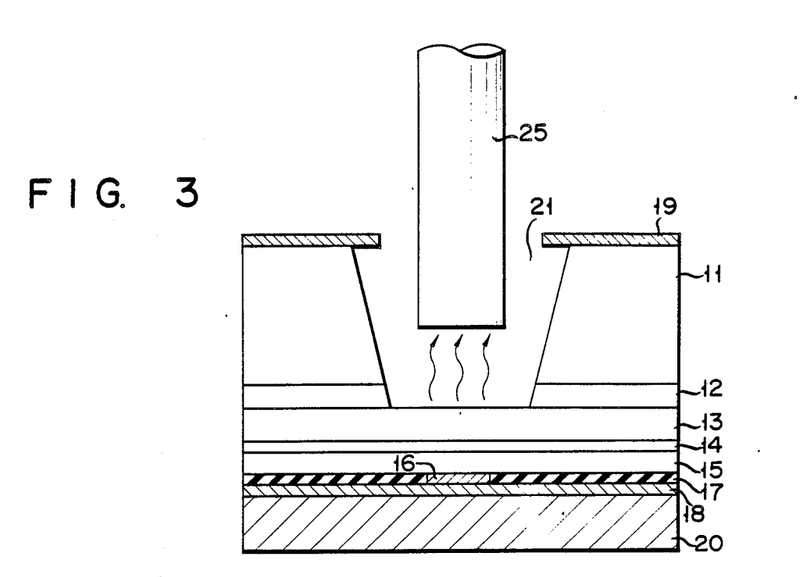
FIG. 3 is a cross-sectional view showing the state in which the LED is coupled to an optical fiber.

Here, the reason why the coupling efficiency for the optical fiber is elevated is that the respective layers are grown by the MOCVD method, whereby no drooping occurs at the crystalline interface. That is, the Burrus type LED is coupled to an optical fiber 25 as shown in FIG. 3, and the LED obtained by the LPE method shows drooping at that surface of the first clad layer 13 exposed by substrate etching, whereby light emitted from the active layer 12 is scattered in the surface of the clad layer 13 so as to lower the coupling efficiency between the LED and the optical fiber 25. In the LED obtained by the MOCVD method, no drooping occurs on that surface of the clad layer 13 which is at a nearly mirror-like state. For this reason, no light scattering occurs, assuring an enhanced coupling efficiency.

The MOCVD method permits a larger-diameter wafer of excellent uniformity to be obtained at low manufacturing costs and, thus, is effective for quantity production. Furthermore, the use of the MOCVD method permits an increase in the amount of Zn doped into the clad layer 15. For this reason, a series resistance induced at the ohmic contact can be decreased, thus suppressing heat generation at the resistive area and assuring a still higher light emission efficiency.

Figure 4:
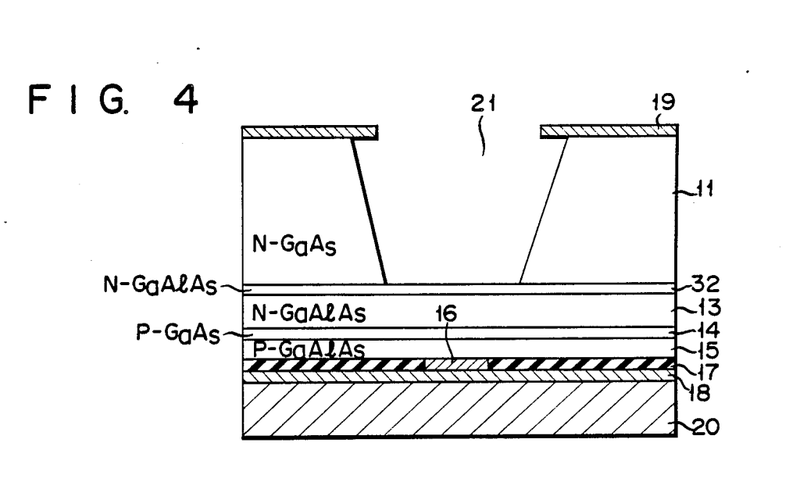
FIG. 4 is a cross-sectional view showing the arrangement of a Burrus type LED according to a second embodiment of this invention.

FIG. 4 is a cross-sectional view showing an arrangement of an LED according to a second embodiment of this invention. This embodiment is different from the first embodiment in that an etching stopper layer 32 containing Al is formed in place of the buffer layer 12.

This arrangement can positively stop, at the etching stopper layer 32, the penetration of the etching for the formation of the light pick-up window. This embodiment permits the obtainment of the same advantages as those of the first embodiment. The arrangement is effective for the control of the etching depth when such control is required in the substrate etching.

Figure 5:
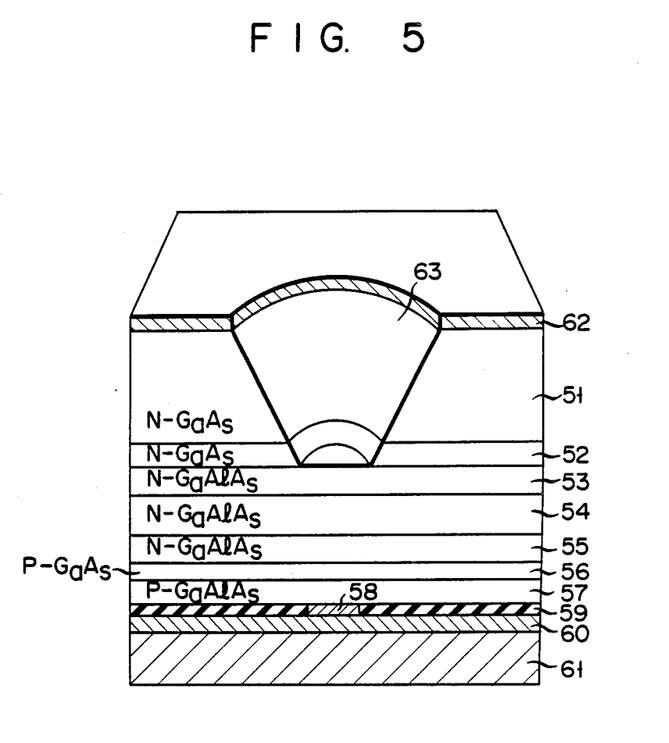
FIG. 5 is a cross-sectional view showing an arrangement of a Burrus type LED according to a third embodiment of this invention.
Figure 6A:
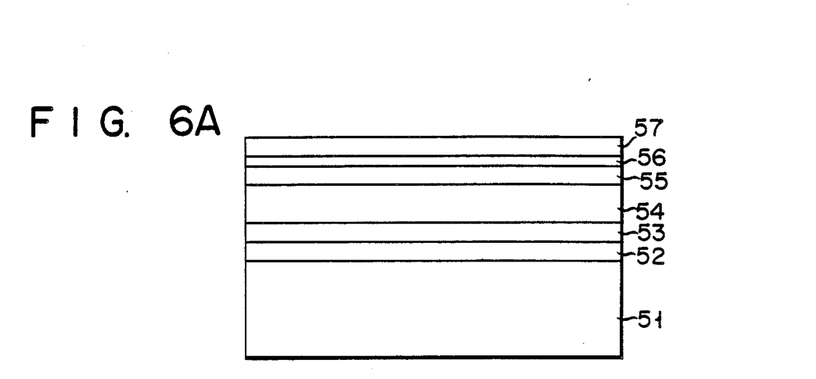
FIGS. 6A to 6C are cross-sectional views showing the steps of manufacturing LED according to the third embodiment of this invention.
Figure 6B:
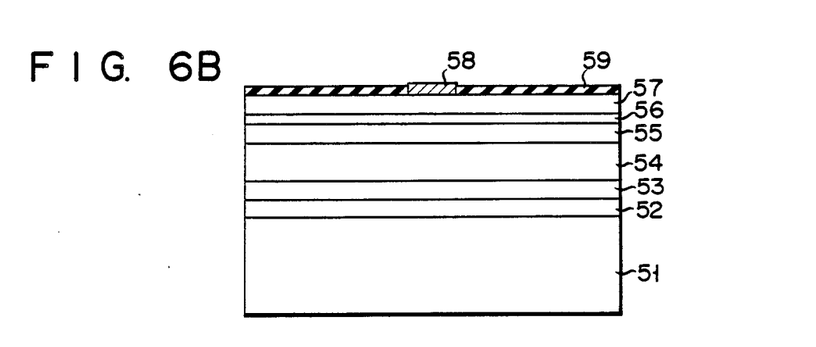
Figure 6C:
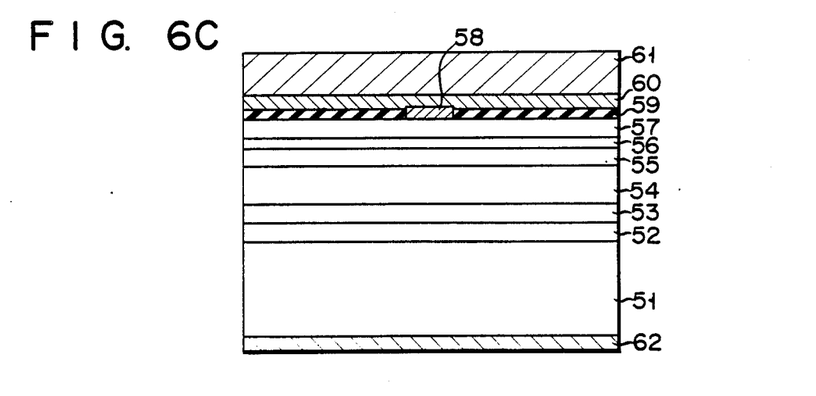

FIG. 5 is a cross-sectional view showing an arrangement of a Burrus type LED according to a third embodiment of this invention, and FIGS. 6A to 6C are cross-sectional views showing the steps of manufacturing the above-mentioned LED. This embodiment is different from the first embodiment in that the N-type clad layer is of a three-layer structure.

In the embodiment of FIG. 5, an N-GaAs buffer layer 52, first clad layer 53 of N-GaAlAs, second clad layer 54 of N-GaAlAs, third clad layer 55 of N-GaAlAs, active layer 56 of P-GaAs and clad layer 57 of P-GaAlAs are grown by the MOCVD method on an N-GaAs substrate 51 in that order as shown in FIG. 6A. Here, the mole fraction, carrier concentration and depth of the respective layers are as shown in Table 2 below. In this connection it is to be noted that Se and Zn were used as an N-type and a P-type dopant, respectively. The temperature for crystal growth was set at 750 [°C.] under the condition that a better surface state is obtained.

TABLE 2

| Samples | AlAs mixed crystal ratio | Carrier concentration cm$^{-3}$ | thickness μm |
|---|---|---|---|
| buffer layer 52 | — | n = 7 × 10$^{17}$ | 2.0 |
| clad layer 53 | 0.35 | n = 2 × 10$^{17}$ | 2.0 |
| clad layer 54 | 0.20 | n = 7 × 10$^{17}$ | 10.0 |
| clad layer 55 | 0.35 | n = 2 × 10$^{17}$ | 1.0 |
| active layer 56 | — | p = 4 × 10$^{17}$ | 1.0 |
| clad layer 57 | 0.35 | p = 5 × 10$^{18}$ | 2.0 |

The above-mentioned numerical values are the most preferable examples, and can be properly varied according to the specification. For example, the AlAs mole fraction X, carrier concentration n and thickness of the first and third N-type clad layers 53 and 55 are 0.3 to 0.45, 0.8 to 4×10$_{17}$ [cm$^{-3}$] and 1 to 3 [μm], respectively, noting that these numerical values can properly be varied within these numeral ranges. Similarly, the AlAs mixed crystal ratio X, carrier concentration and thickness of the second clad layer 54 are 0.1 to 0.25, 4 to 8×10$^{17}$ [cm$^{-3}$] and 5 to 20 [μm], respectively, noting that these numeral values can properly be varied within these ranges.

As shown in FIG. 6B, after a 3,000 to 4,000 [Å]-thick ohmic electrode (contact metal) 58 made of AuZn (5% Zn) was formed on the P-type clad layer 57, it was etched, with a I$_2$—KI—H$_2$O (weight ratio: 1:1:4)-based etching solution, with a photoresist as a mask to leave a circular electrode 58 of 30 [μm] in diameter. Then, a 3,000 [Å]-thick SiO$_2$ film 59 was formed by the CVD method on the surface of the P-side layer, followed by etching the SiO$_2$ film 59 on the ohmic electrode 58 with a photoresist as a mask by using an ammonium fluoride solution.

Then, as shown in FIG. 6C, a 1,000 [Å] Cr layer and 5,000 [μm] Au layer were formed on the surface of the P-side layer to form a P side electrode 60. Then, an about 20 [μm] heat sink 61 of Au was formed by an electroplating method on the surface of the P-side electrode 60. Then, a 5,000 [Å] layer of AuGe (0.5% Ge) and 1,000 [Å] layer of Au were evaporated on the rear surface of the substrate 51 to form an N-side electrode 62.

Thereafter, using a photoresist as a mask, that circular portion of an N-side electrode 62 which had a diameter of 150 [μm] and which was opposite to the ohmic electrode 58 was removed. With the N-side electrode 62 as a mask, the substrate 51 and buffer layer 52 were etched, with an NH$_4$OH—H$_2$O-based etching solution, to a depth leading to the first clad layer 53 of the N-type. A light pick-up window 63 was formed by this etching step and thus a Burrus type LED as shown in FIG. 5 was completed.

When the NH$_4$OH—H$_2$O (weight ratio: 1:30) is used as an etching solution for window formation, the etching rate of GaAs in the substrate 51 and buffer layer 52 is about 10 times as fast as that of the first clad layer 53 (GaAlAs) of the N-type and, therefore, the first clad layer 53 acts as an etching stopper layer when the light pick-up window 63 is formed. In the LED which is formed as shown in FIG. 5, the heat sink 61 is mounted on a stem, not shown.

In the LED so formed, the forbidden band width of the N-type clad layers 53, 54 and 55 is greater than the forbidden band width of the active layer 56 and, therefore, light emitted from the active layer 56 is taken out without absorption at the interior of the LED structure. In the three-layer structure of the N-type clad layers, the confinement of carriers due to the presence of a double hetero-junction structure is carried out through the third clad layer 55, the reduction of the series resistance in the LED is carried out through the second clad layer 54 and the first clad layer 53 serves as an etching stopper layer when the light pick-up window is formed.

Since, in the LED as shown in FIG. 1, the carrier concentration n of the N-type clad layer 13 is at the low level of $n=2\times 10_{17}$ [cm$^{-3}$], a greater spreading resistance is involved due to the current through the layer 13, presenting the problem that the light emission power at the LED is saturated due to the influence of the heat generation resulting from the spreading resistance. The reason for this is as follows: That is, where the LED is manufactured by the MOCVD method, the carrier concentration of an N-Ga$_{1-x}$Al$_x$As layer is not generally increased with an increase in the AlAs mixed crystal ratio X. When, therefore, the N-type clad layer 13 is grower with the AlAs mixed crystal ratio X as 0.35, the carrier concentration n does not exceed a level of $n=2\times 10^{17}$ [cm$^{-3}$]. If, on the other hand, the AlAs mixed crystal ratio X of the N-type clad layer 13 is decreased so as to lower the spreading resistance, the confinement of injection carriers due to the presence of the double hetero-junction structure becomes incomplete, resulting in lowered light emission power. Such a problem is solved according to the third embodiment of this invention.

According to the third embodiment of this invention, therefore, injection carriers can be positively confined through the action of the third clad layer 55 and the spreading resistance can be decreased through the action of the second clad layer 54. This embodiment, of course, produces the same effect as that of the first embodiment of this invention. Furthermore, it is possible to beforehand prevent the light emission power from being dropped due to the influence of heat resulting from the series resistance at the LED. Therefore, a still higher output power can be assured due to such light emission characteristic.

Figure 7:
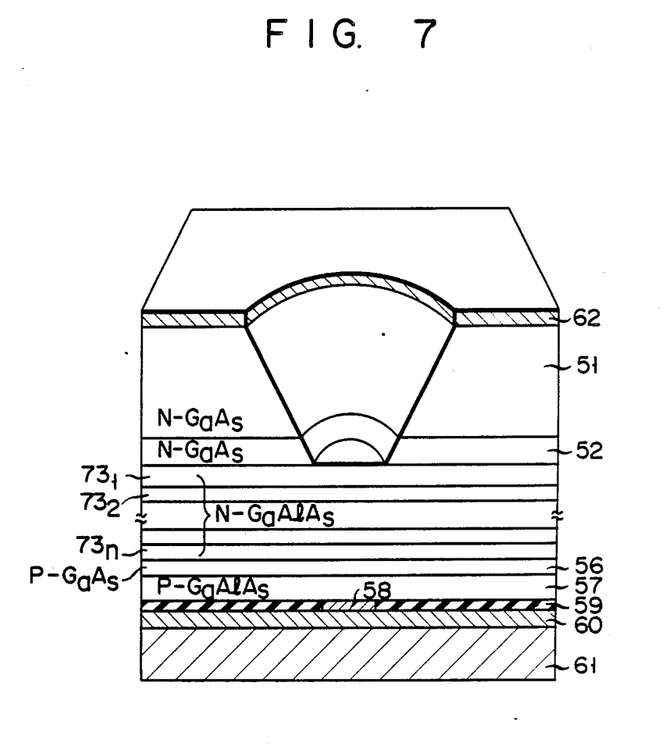
FIG. 7 is a cross-sectional view showing an arrangement of a Burrus type LED according to a fourth embodiment of this invention.

FIG. 7 is a cross-sectional view showing an arrangement of a Burrus type LED according to a fourth embodiment of this invention. In FIG. 7, the same reference numerals are employed to designate portions corresponding to those shown in FIG. 5, and, therefore, no further explanation is included for brevity. This embodiment is different from the third embodiment in that the N-type clad layer is formed as three or more layers. That is, a number of N-GaAlAs layers 73₁, ..., 73$_N$ are formed, as the N-type clad layers, between the N-type buffer layer 52 and the P-type active layer.

In this case, those layers near the active layer 56 should be formed so that, in order to assure a positive confinement of injection carriers, the AlAs mole traction X is set to be higher than 0.3; the intermediate layer should be so formed that, in order to adequately raise the carrier concentration, the AlAs mixed crystal ratio X is set to be adequately small; and the layer in contact with the buffer layer 52 should be so formed that, in order to act as a stopper layer when the etching step is carried out, the AlAs mole fraction X is set to be somewhat greater.

In the embodiment of FIG. 7, it is also possible to produce the same effect as in the third embodiment. Furthermore, the AlAs, mole traction X in the N-type clad layer can be varied in a step-like fashion to permit the mole traction X to vary in a near-continuous state.

This invention is not restricted to the above-mentioned respective embodiments. In the first and second embodiments, for example, various conditions involved during the time of a crystal growth by the MOCVD method can be changed in accordance with the semiconductor layer to be grown and the other specification. In the third and fourth embodiments, an MBE (Molecular Beam Epitaxy) method can be used in place of the MOCVD method. Furthermore, the N-type clad layer structure is not restricted to the three or more layer structure. That is, a two-layer structure may be adopted with the first clad layer omitted, provided that the etching rate of the second clad layer is sufficiently slower than that of the GaAs layers (the substrate and buffer layer) when an etching step is carried out.

In place of the SiO$_2$ film (the insulating film) formed on the above-mentioned clad layer to permit current to be narrowed, use may be made of a semiconductor layer having a conductivity opposite to that of the above-mentioned clad layer. The semiconductor material which is used for the substrate and respective layers is not restricted to the GaAs/GaAlAs-based material only. It is also possible to use an InP/InGaAsP-based material or the other semiconductor material belonging to Group III–V compounds. This invention can be changed or modified in a variety of ways without departing from the spirit and scope of this invention.

What is claimed is:

1. In a light emitting diode made of a compound semiconductor material, comprising:
   a semiconductor substrate of a first conductivity type;
   a double hetero-junction structure obtained by sequentially forming at least a clad layer of a first conductivity type, an active layer, and a clad layer of the second conductivity type by a vapor deposition method on the substrate in that order; and
   a current narrowing structure obtained by selectively forming a contact metal on the clad layer of the second conductivity type in the double hetero-junction structure with an insulating film formed around the contact metal,
   in which, among the clad layers in the double hetero-junction structure, the clad layer closer to said semiconductor substrate and is comprised of a multi-layer structure having different composition ratio, and the layer forming the double-layer and the doublelayer forming the multi-layer structure and closer to the active layer has a wider forbidden band than that of the other layer in the multi-layer (s) structure.

2. In a light emitting diode according to claim 1, in which said clad layer closer to the substrate are of a three-layer structure with a layer of a narrower forbidden band width sandwiched between the remaining two layers of a wider forbidden band width.

3. In a light emitting diode according to claim 1, in which said substrate is comprised of a GaAs substrate, said respective layers are formed of a GaAs/GaAlAs-based material, said clad layer closer to the substrate is formed of Ga$_{1-x}$Al$_x$As and the AlAs mole fraction X on the side of the active layer is set to be greater than 0.3.

4. In a light emitting diode according to claim 1, in which, as in said vapor deposition method, use is made of a metal organic chemical vapor deposition method or a molecular beam epitaxial growth method.

5. In a light emitting diode according to claim 1, in which in a position corresponding to said contact metal on the substrate a light pick-up window is formed by etching the substrate from the reverse side of the substrate.

6. In a light emitting diode made of a compound semiconductor material, comprising:
 a semiconductor substrate of a first conductivity type;
 a double hetero-junction structure obtained by sequentially forming at least a clad layer of the first conductivity type, an active layer and a clad layer of the second conductivity type by a vapor deposition method on the substrate in that order; and
 a current narrowing structure obtained by selectively forming a contact metal on the clad layer of the second conductivity type in the double hetero-junction structure with a reverse junction formed around the contact metal,
 in which, among the clad layers in the double hetero-junction structure, the clad layer closer to said semiconductor substrate is of a multi-layer forming the multi-layer composition ratio, and the layer forming the multi-layer structure and closer to the active layer has a wider forbidden band than that of the other layer(s) in the multi-layer structure.

7. A light emitting diode according to claim 6, in which said clad layer closer to the substrate is of a three-layer structure with a layer of a narrower forbidden band width sandwiched between the remaining two layers of a wider forbidden band width.

8. A light emitting diode according to claim 6, in which said substrate is comprised of a GaAs substrate, said respective layers are formed of a GaAs/GaAlAs-based material, said clad layer closer to the substrate is formed of $Ga_{1-x}Al_xAs$ and the AlAs mole fraction X on the side of the active layer is set to be greater than 0.3.

9. A light emitting diode according to claim 6, in which, as in said vapor deposition method, use is made of a metal organic chemical vapor deposition method or a molecular beam epitaxial growth method.

10. A light emitting diode according to claim 6, in which in a position corresponding to said contact metal on the substrate a light pick-up window is formed by etching the substrate from the reverse side of the substrate.

* * * * *